United States Patent
Shei

(10) Patent No.: US 7,564,069 B2
(45) Date of Patent: Jul. 21, 2009

(54) LIGHT-EMITTING DIODE INCLUDING PIT THEREIN

(75) Inventor: Shih-Chang Shei, Tainan County (TW)

(73) Assignee: Epistar Corporation, Hsinchu (TW)

( * ) Notice: Subject to any disclaimer, the term of this patent is extended or adjusted under 35 U.S.C. 154(b) by 373 days.

(21) Appl. No.: 11/206,214

(22) Filed: Aug. 18, 2005

(65) Prior Publication Data

US 2006/0284188 A1    Dec. 21, 2006

(30) Foreign Application Priority Data

Jun. 21, 2005    (TW) .............................. 94120643 A

(51) Int. Cl.
*H01L 33/00*    (2006.01)
(52) U.S. Cl. ................. 257/94; 257/E33.069
(58) Field of Classification Search .................... 257/94, 257/103, E33.069
See application file for complete search history.

(56) References Cited

U.S. PATENT DOCUMENTS 6,956,246 B1 *  10/2005  Epler et al. ................... 257/94
2004/0245543 A1 * 12/2004  Yoo ............................ 257/103
2005/0214965 A1 *  9/2005  Park et al. ..................... 438/33
2006/0214173 A1 *  9/2006  Beeson et al. ................. 257/88

FOREIGN PATENT DOCUMENTS

KR    2004058479 A  *  7/2004  .................. 438/33

* cited by examiner

*Primary Examiner*—Thomas L Dickey
(74) *Attorney, Agent, or Firm*—Jianq Chyun IP Office

(57) ABSTRACT

A light-emitting diode (LED) and a method for manufacturing the same are described. The light-emitting diode has a first substrate. An illuminant epitaxial structure is deposited on a surface of the first substrate, in which the illuminant epitaxial structure has a first surface and a second surface opposite each other, the first surface is relatively adjacent to the first substrate, and the illuminant epitaxial structure includes at least one pit in the second surface. A second substrate is deposited on the second surface of the illuminant epitaxial structure. An adhesion layer is deposited between the second surface of the illuminant epitaxial structure and the second substrate to bond the second substrate to the illuminant epitaxial structure.

13 Claims, 5 Drawing Sheets

US 7,564,069 B2

LIGHT-EMITTING DIODE INCLUDING PIT THEREIN

RELATED APPLICATIONS

The present application is based on, and claims priority from, Taiwan Application Serial No. 94120643, filed Jun. 21, 2005, the disclosure of which is hereby incorporated by reference herein in its entirety.

FIELD OF THE INVENTION

The present invention relates to a light-emitting diode and a method for manufacturing the same, and more particularly, to a light-emitting diode and a method for manufacturing the same with a high wafer bonding yield.

BACKGROUND OF THE INVENTION

In the fabrication of light-emitting diodes, III-nitride-based semiconductors, such as GaN, AlGaN, InGaN and AlInGaN, are common. Typically, epitaxial structures of most of the light-emitting devices made of the III-nitride-based semiconductors are grown on an electrically insulating sapphire substrate, which is different from other light-emitting devices utilizing conductive substrates. The sapphire substrate is an insulator, so an electrode cannot be directly formed on the sapphire substrate. Electrodes have to be formed to contact respectively a p-type semiconductor layer and an n-type semiconductor layer directly, so that the light-emitting devices of the aforementioned type can be completed.

FIGS. 1a through 1d are schematic flow diagrams showing the process for manufacturing a conventional light-emitting diode. A substrate 100 made of sapphire is provided, and then an n-type semiconductor layer 102, an active layer 104, and a p-type semiconductor layer 106 are grown on the substrate 100 in sequence by an epitaxial method. The n-type semiconductor layer 102, the active layer 104 and the p-type semiconductor layer 106 comprise an illuminant epitaxial structure 108, such as shown in FIG. 1a.

An electrically conductible substrate 110 is provided, and an adhesion layer 112 is formed on a surface of the substrate 110, such as shown in FIG. 1b. Next, a wafer bonding step is performed to adhere the substrate 110 to the p-type semiconductor layer 106 by the adhesion layer 112 for achieving the connection of the substrate 110 and the illuminant epitaxial structure 108, such as shown in FIG. 1c. After the substrate 110 and the illuminant epitaxial structure 108 are bonded, the electrically insulating substrate 100 is removed to complete the manufacturing of a light-emitting diode 114, such as shown in FIG. 1d.

However, in such a bonding technique, bubbles are produced at the bonding interface between the illuminant epitaxial structure 108 and the adhesion layer 112 when the bonding step is performed by using the adhesion layer 112. The bubbles greatly degrade the bonding strength. Due to the insufficient bonding strength, the substrate 110 very easily falls off the illuminant epitaxial structure 108 or chip, thereby degrading the yield of the sequent processes.

SUMMARY OF THE INVENTION

Therefore, one objective of the present invention is to provide a light-emitting diode, in which at least one pit is formed in a surface of an illuminant epitaxial structure. When a bonding process of the illuminant epitaxial structure and another substrate is performed on the surface, the amount of bubbles remaining at the bonding interface can be greatly decreased, thereby can increasing the bonding strength.

Another objective of the present invention is to provide a method for manufacturing a light-emitting diode, in which at least one pit is formed in a bonding surface of an illuminant epitaxial structure to provide space for the escape of the bubbles produced at the bonding interface. The adhesion force between the illuminant epitaxial structure and a bonding substrate can thus be effectively enhanced, thereby preventing the substrate from falling off as a result of the insufficient bonding strength.

According to the aforementioned objectives, the present invention provides a light-emitting diode, comprising the following elements. A first substrate is provided. An illuminant epitaxial structure is disposed on a surface of the first substrate. The illuminant epitaxial structure has a first surface and a second surface on opposite sides. The first surface is relatively adjacent to the first substrate, and the illuminant epitaxial structure includes at least one pit in the second surface. A second substrate is deposited on the second surface of the illuminant epitaxial structure. An adhesion layer is deposited between the second surface of the illuminant epitaxial structure and the second substrate to bond the second substrate to the illuminant epitaxial structure.

According to a preferred embodiment of the present invention, a depth of the at least one pit is between about 10 nm and 50 µm.

According to the objectives, the present invention provides a method for manufacturing a light-emitting diode, comprising the following steps. A first substrate is provided. An illuminant epitaxial structure is formed on a surface of the first substrate. The illuminant epitaxial structure has a first surface and a second surface on opposite sides. The first surface is relatively adjacent to the first substrate. At least one pit is formed in the second surface of the illuminant epitaxial structure. A second substrate is provided. An adhesion layer is deposited on a surface of the second substrate. A bonding step is performed to bond the second substrate to the second surface of the illuminant epitaxial structure by using the adhesion layer. A plurality of bubbles formed at a bonding interface during the bonding step are thus made to escape to the at least one pit or outside of the illuminant epitaxial structure.

According to a preferred embodiment of the present invention, the illuminant epitaxial structure includes many pits, and the pits are respectively located in a plurality of sawing streets of the light-emitting diode for the advantage of sawing the light-emitting diode into a plurality of light-emitting diode chips.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a light-emitting diode and a method for manufacturing the same, which can increase the bonding strength of an illuminant epitaxial structure and a bonding substrate, so as to achieve the purpose of enhancing the device reliability and process yield. In order to make the illustration of the present invention more explicit and complete, the following description is stated with reference to FIGS. 2a through 2f.

Figure 1A:
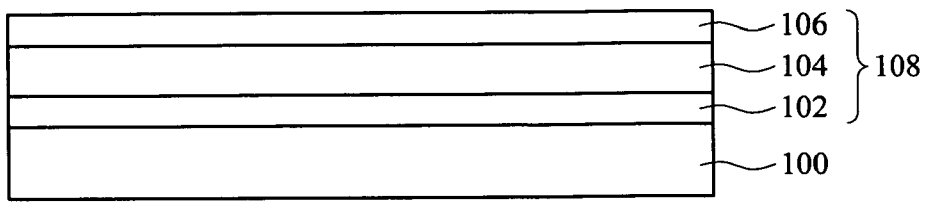
FIGS. 1a through 1d are schematic flow diagrams showing the process for manufacturing a conventional light-emitting diode.
Figure 1B:
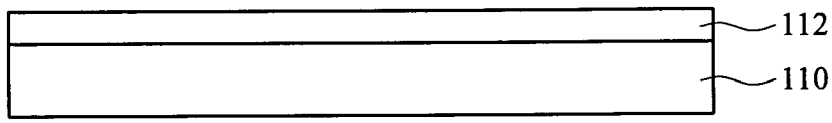
Figure 1C:
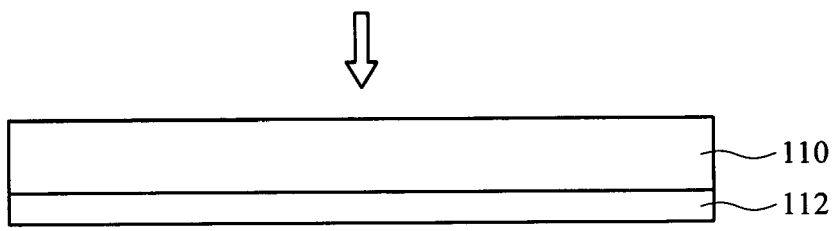
Figure 1D:
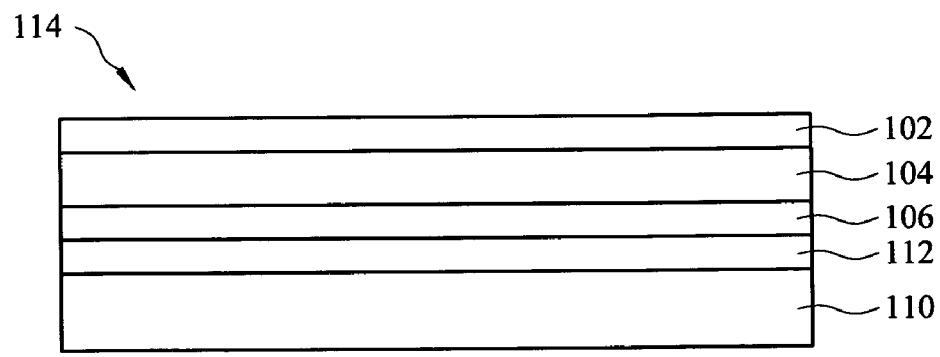
Figure 2A:
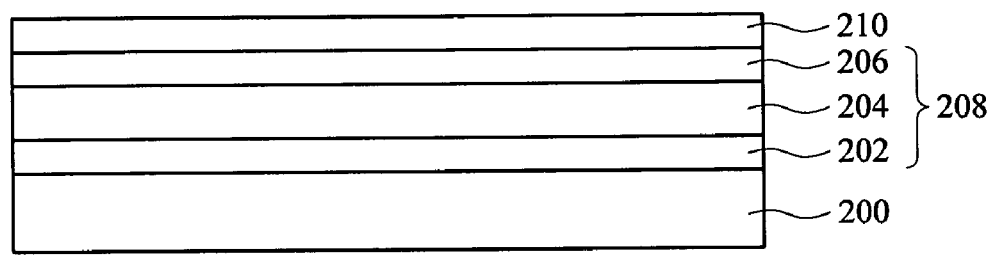
FIGS. 2a through 2e are schematic flow diagrams showing the process for manufacturing a light-emitting diode in accordance with a preferred embodiment of the present invention.

FIGS. 2a through 2e are schematic flow diagrams showing the process for manufacturing a light-emitting diode in accordance with a preferred embodiment of the present invention. In the manufacturing of the light-emitting diode of the present embodiment, a growth substrate 200 for epitaxy is provided, in which a material of the growth substrate 200 may be sapphire, GaAs or any other III-V-based semiconductor materials. An illuminant epitaxial structure 208 is formed on a surface of the growth substrate 200 by, for example, an epitaxial method, in which the illuminant epitaxial structure 208 comprises a first conductivity type semiconductor layer 202, an illuminant layer 204 and a second conductivity type semiconductor layer 206 stacked on the growth substrate 200 in sequence. In the present invention, the first conductivity type and the second conductivity type are opposite conductivity types. In other words, when the first conductivity type is n-type, the second conductivity type is p-type; when the first conductivity type is p-type, the second conductivity type is n-type. A material of the first conductivity type semiconductor layer 202 and a material of the second conductivity type semiconductor layer 206 may be III-V-based semiconductor compounds, such as GaN, AlGaN, InGaN or AlInGaN. The illuminant layer 204 may be composed of a double heterostructure or a multiple quantum well structure, such as an InGaN/GaN multiple quantum well structure. After the illuminant epitaxial structure 208 is formed, an adhesion layer 210 is formed on a surface of the second conductivity type semiconductor layer 206, such as shown in FIG. 2a, by a deposition method, for example. The adhesion layer 210 is composed of a conductive material, and a material of the adhesion layer 210 is preferably ITO, IZO, metal or an organic material, for example. In the present invention, the adhesion layer 210 may be composed of a single-layer structure, or a multi-layer structure. In some embodiments, the adhesion layer 210 may also have a reflecting function and/or a diffusion-preventing function.

Figure 2B:
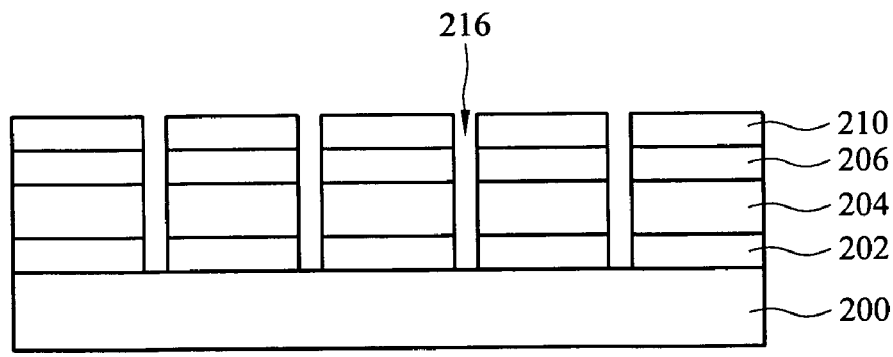

Next, a portion of the adhesion layer 210 and a portion of the underlying illuminant epitaxial structure 208 are removed by a dry etching method or a wet etching method, so as to form at least one pit 216 in the illuminant epitaxial structure 208. In the present invention, the pit 216 is preferably formed by, for example, an inductively coupled plasma (ICP) etching method. The amount of pits 216 is at least one, and, preferably, more pits 216 are dispersedly formed in a surface of the illuminant epitaxial structure 208, in which any etching pattern may be formed in the surface of the etched illuminant epitaxial structure 208. These pits may be of the same or different depths, and the depths of the pits are preferably between about 10 nm and 50 μm. In the present embodiment, the pits penetrate through the illuminant epitaxial structure 208, so that the bottoms of the pits 216 expose a portion of the substrate 200, such as shown in FIG. 2b. In some embodiments, the pits of different depths may be formed by one or more etching processes. In other embodiments, the pits of different depths may be formed by one or more etching techniques.

Figure 2C:
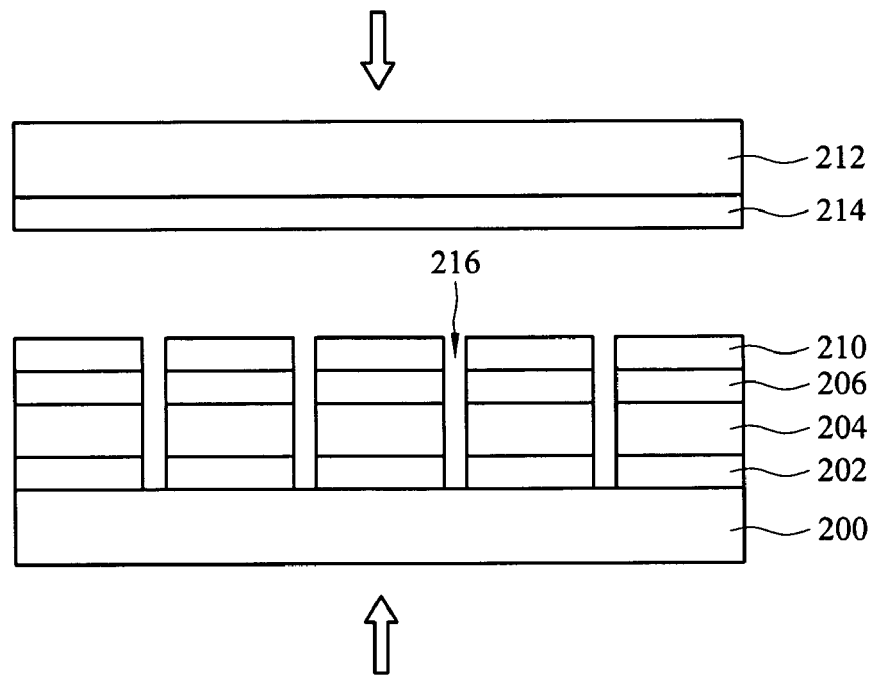

In the meanwhile, a bonding substrate 212 required to be bonded to the illuminant epitaxial structure 208 is provided, in which a material of the bonding substrate 212 may be Si, Mo, ceramic, metal or semiconductors, for example. An adhesion layer 214 is formed on a bonding surface of the bonding substrate 212 by, for example, a deposition method. The adhesion layer 214 is composed of a conductive material, such as ITO, IZO, metal or organic materials, preferably. Then, the bonding substrate 212 is bonded to the surface, where the pits 216 are formed, of the illuminant epitaxial structure 208 by, for example, a thermal pressing process with the adhesion layer 214 on the bonding substrate 212 and the adhesion layer 210 on the illuminant epitaxial structure 208, such as shown in FIG. 2c. A heating method used in the thermal pressing process may be a resistance-heating method, a bulb-heating method, a radio frequency (RF) heating method or a microwave (MW) heating method, for example. The bonding surface of the illuminant epitaxial structure 208 has at least one pit 216, so that bubbles induced at a bonding interface, i.e. an interface of the two adhesion layers 210 and 214, during the bonding step can escape to the pit 2162 or the outside of the illuminant epitaxial structure 208. Thus, the bubbles induced at the bonding interface can be effectively eliminated, which can increase the bonding strength of the bonding substrate 212 and the illuminant epitaxial structure 208.

It is worthy of note that each of the illuminant epitaxial structure 208 and the bonding substrate 212 includes an adhesion layer in the aforementioned embodiment. The bonding substrate 212, however, can be successfully bonded to the illuminant epitaxial structure 208 when only one of the illuminant epitaxial structure 208 and the bonding substrate 212 include an adhesion layer in other embodiments of the present invention.

Figure 2D:
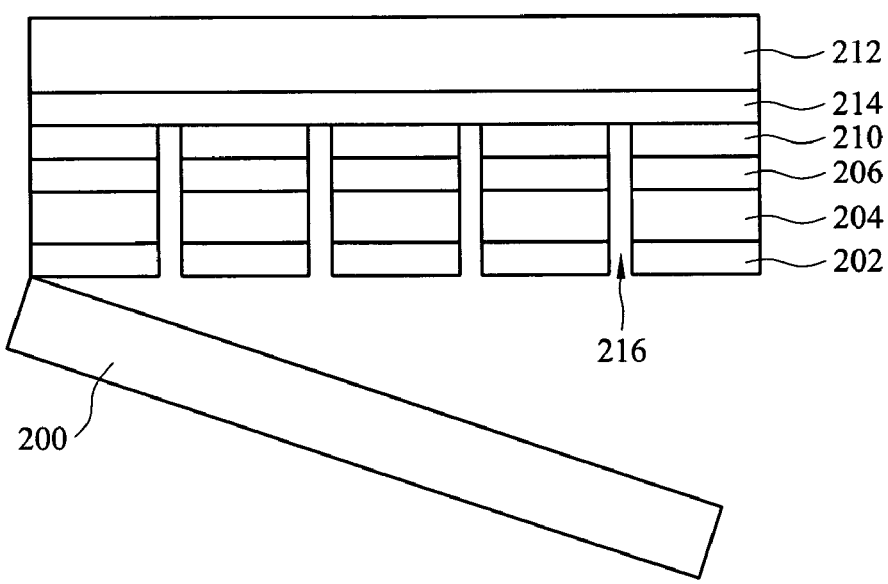
Figure 2E:
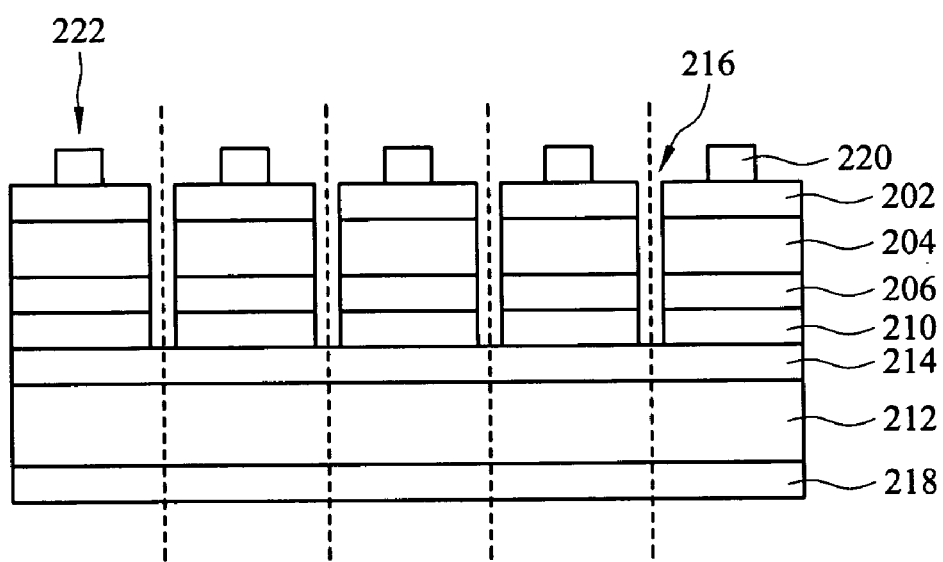

In a preferred embodiment of the present invention, these pits 216 may be respectively deposited in sawing streets of the light-emitting diode, which can be advantageous to the subsequent separation process of the light-emitting diode chips 222, as shown in FIG. 2e.

After the bonding process, when the growth substrate 200 is composed of an insulating material, the growth substrate 200 is preferably removed from the illuminant epitaxial structure 208. When the growth substrate 200 is composed of a conductive material, the growth substrate 200 may or may not be removed. In the present embodiment, after the bonding process, the growth substrate 200 is removed from the illuminant epitaxial structure 208, such as shown in FIG. 2d, by an etching method, a polishing method or a heating method, for example. The growth substrate 200 is preferably removed by a laser heating method.

Figure 2F:
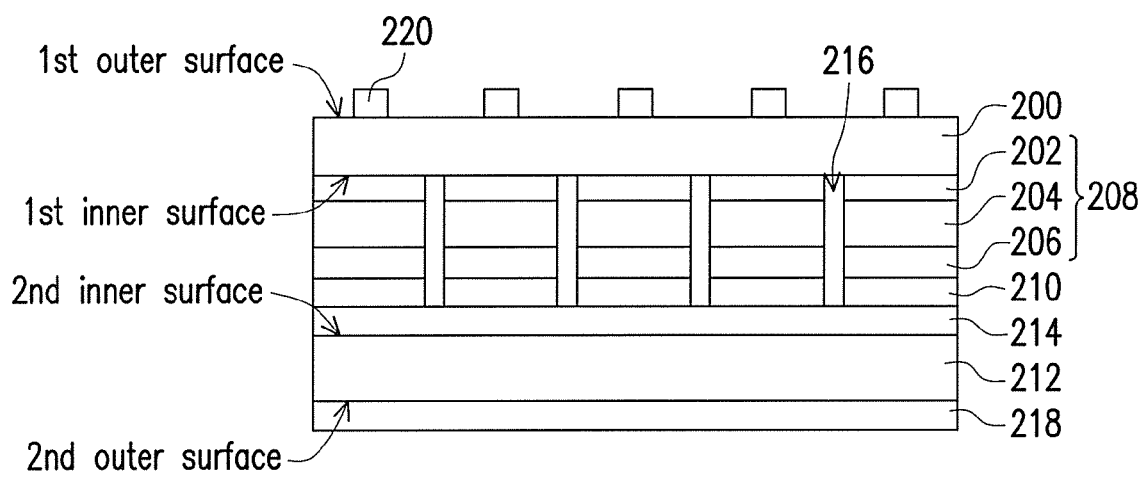
FIG. 2f is a cross-sectional view of a light-emitting diode in accordance with another preferred embodiment of present invention.

Then, a second conductivity type electrode 218 and a first conductivity type electrode 220 are respectively formed on a surface opposite the bonding surface of the bonding substrate 212 and the first conductivity type semiconductor layer 202 of the illuminant epitaxial structure 208, as shown in FIG. 2e. In another embodiment, when the growth substrate 200 is composed of a conductive material, and the growth substrate 200 is not removed from the surface of the illuminant epitaxial structure 208 after the bonding process, the first conductivity type electrode 220 is formed on the growth substrate 200, and the growth substrate 200 is located between the first conductivity type electrode 220 and the surface of the illuminant epitaxial structure 208, as shown in FIG. 2f. Materials of the first conductivity type electrode 220 and the second conductivity type electrode 218 may be, for example, metal or metal alloys. In the present embodiment, after the electrodes of two conductivity types are formed, a sawing process may be performed along the pits 216 extending along the sawing streets to form a plurality of light-emitting diode chips 222.

According to the aforementioned description, one advantage of the present invention is that at least one pit is formed in a bonding surface of an illuminant epitaxial structure of the present light-emitting diode, so that when a bonding process of the illuminant epitaxial structure and a bonding substrate is performed, the amount of bubbles remaining at the bonding interface can be greatly decreased, which can prevent the bonding strength from being decreased resulting from the existence of the bubbles. The purpose of increasing the bonding strength is thereby achieved.

According to the aforementioned description, another advantage of the present invention is that before a bonding step is performed, at least one pit is formed in a bonding surface of an illuminant epitaxial structure in the present method for manufacturing a light-emitting diode. The at least one pit makes the bubbles produced at the bonding interface escape from the bonding interface through the pit. Therefore, the adhesion force between the illuminant epitaxial structure and a bonding substrate can be greatly enhanced to intensify the bonding of the bonding substrate and the illuminant epitaxial structure. The purpose of preventing the bonding substrate from falling off or cracking is thus achieved.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A light-emitting diode, comprising:
   a conductive growth substrate having a first inner surface and a first outer surface opposite to the first inner surface;
   a conductive bonding substrate having a second inner surface and a second outer surface opposite to the second inner surface;
   an illuminant epitaxial structure sandwiched between the second inner surface of the conductive bonding substrate and the first inner surface of the conductive growth substrate, wherein the illuminant epitaxial structure has a plurality of pits therein;
   a first electrode disposed on the first outer surface of the conductive growth substrate; and
   a second electrode disposed on the second outer surface of the conductive bonding substrate.

2. The light-emitting diode according to claim 1, wherein the pits are identical in depth.

3. The light-emitting diode according to claim 1, wherein the pits penetrate through the illuminant epitaxial structure.

4. The light-emitting diode according to claim 1, wherein a depth of each pit is between about 10 nm and about 50 μm.

5. The light-emitting diode according to claim 1, wherein the pits are of different depths.

6. The light-emitting diode according to claim 1, further comprising an adhesion layer, wherein the adhesion layer comprises:
   a first adhesion layer disposed on the second inner surface; and
   a second adhesion layer disposed between the first adhesion layer and the illuminant epitaxial structure.

7. The light-emitting diode according to claim 6, wherein a material of the first adhesion layer comprises indium tin oxide, indium zinc oxide, metal, or organic materials.

8. The light-emitting diode according to claim 6, wherein a material of the second adhesion layer comprises indium tin oxide, indium zinc oxide, metal, or organic materials.

9. The light-emitting diode according to claim 1, further comprising an adhesion layer, wherein the adhesion layer is a single-layer structure.

10. The light-emitting diode according to claim 1, wherein a material of the conductive growth substrate comprises metal.

11. The light-emitting diode according to claim 1, wherein a material of the conductive bonding substrate comprises metal.

12. The light-emitting diode according to claim 1, further comprising an adhesion layer disposed on the second inner surface of the conductive bonding substrate.

13. The light-emitting diode according to claim 12, wherein the illuminant epitaxial structure is sandwiched between the adhesion layer and the first inner surface of the conductive growth substrate.

* * * * *